(12) United States Patent
Iyengar et al.

(10) Patent No.: US 8,324,929 B1
(45) Date of Patent: Dec. 4, 2012

(54) INTEGRATED CIRCUIT WITH RECONFIGURABLE INPUTS/OUTPUTS

(75) Inventors: Vinay Raja Iyengar, Cupertino, CA (US); Venkat Rajendher Reddy Gaddam, Sunnyvale, CA (US); Bindiganavale S. Nataraj, Cupertino, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 42 days.

(21) Appl. No.: 12/826,124

(22) Filed: Jun. 29, 2010

Related U.S. Application Data

(63) Continuation of application No. 12/012,672, filed on Feb. 4, 2008, now Pat. No. 7,782,084.

(51) Int. Cl.
*H03K 19/173* (2006.01)
*H03K 19/00* (2006.01)
(52) U.S. Cl. .......................................... 326/38; 326/93
(58) Field of Classification Search .............. 326/37–41, 326/47, 101, 93–98
See application file for complete search history.

(56) References Cited

U.S. PATENT DOCUMENTS

| | | | |
|---|---|---|---|
| 6,034,536 A * | 3/2000 | McClintock et al. | 326/10 |
| 6,521,994 B1 | 2/2003 | Huse et al. | |
| 6,750,552 B1 | 6/2004 | Narayanan | |
| 6,864,122 B1 | 3/2005 | Huse et al. | |
| 6,894,531 B1 | 5/2005 | Nouban et al. | |
| 6,943,060 B1 | 9/2005 | Narayanan | |
| 7,170,179 B1 * | 1/2007 | Shah | 257/773 |
| 7,176,714 B1 * | 2/2007 | Lee et al. | 326/38 |
| 7,620,929 B1 * | 11/2009 | Jang et al. | 716/104 |
| 7,739,097 B2 * | 6/2010 | Sample et al. | 703/19 |
| 7,782,084 B1 | 8/2010 | Iyengar et al. | |
| 2005/0268208 A1 | 12/2005 | Shimizume et al. | |

OTHER PUBLICATIONS

Pending U.S. Appl. No. 12/012,672 by Vinay Raja Iyengar et al., filed Feb. 4, 2008 (the parent application of this patent application).

* cited by examiner

*Primary Examiner* — Thienvu Tran
(74) *Attorney, Agent, or Firm* — Sterne, Kessler, Goldstein & Fox P.L.L.C.

(57) ABSTRACT

An integrated circuit device can include a core section coupled to a plurality of signal paths having a predetermined physical order with respect to one another. A configuration circuit can selectively connect each signal path to a corresponding one of a plurality of physical connection points to the IC device according to one of at least two different physical orders in response to configuration information.

20 Claims, 11 Drawing Sheets

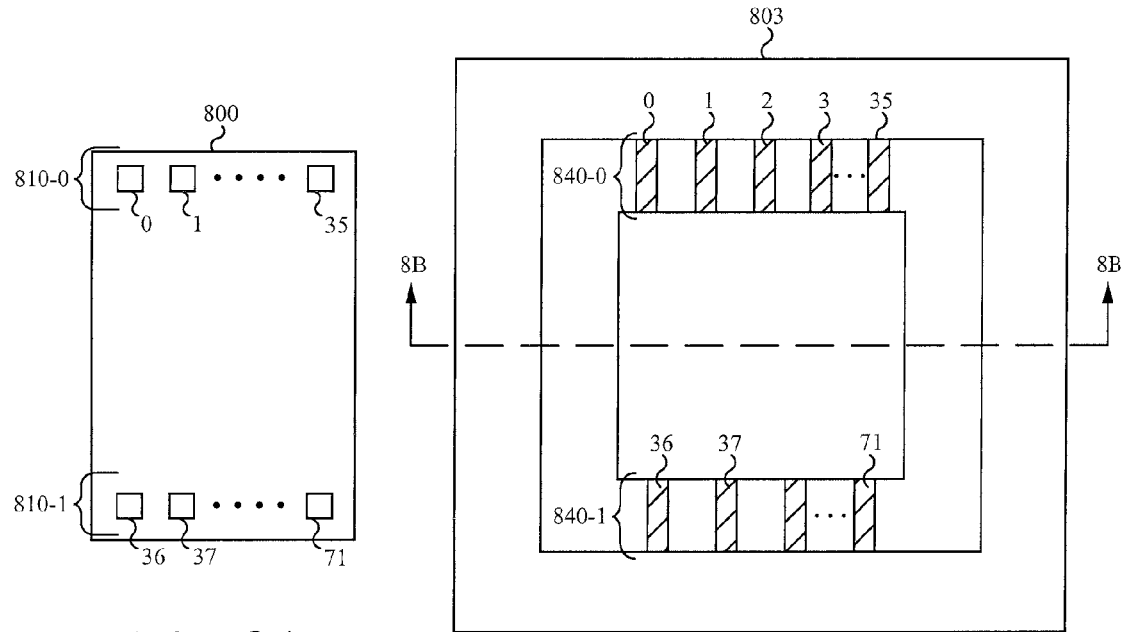
Fig. 8A
(Background Art)
Fig. 8B
(Background Art)
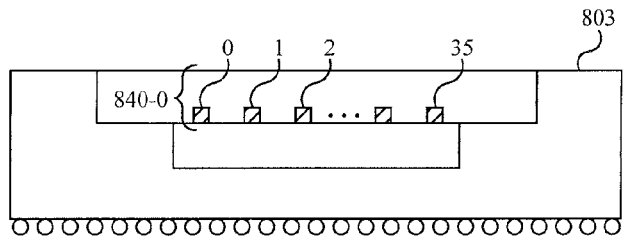
Fig. 8C
(Background Art)

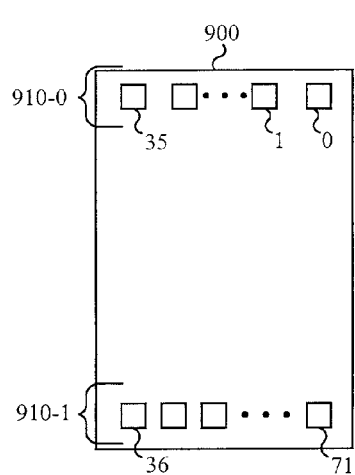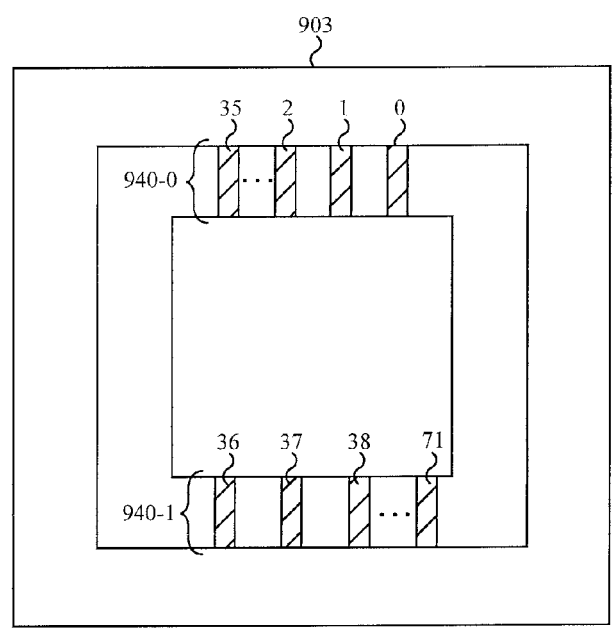
Fig. 9A
(Background Art)
Fig. 9B
(Background Art)

INTEGRATED CIRCUIT WITH RECONFIGURABLE INPUTS/OUTPUTS

This application is a continuation of U.S. patent application Ser. No. 12/012,672 filed on Feb. 4, 2008, now U.S. Pat. No. 7,782,084 issued on Aug. 24, 2010, the contents of which are incorporated by reference herein.

TECHNICAL FIELD

The present invention relates generally to Integrated Circuit (IC) devices, and more particularly to IC devices having reconfigurable inputs or outputs.

BACKGROUND OF THE INVENTION

Integrated Circuit (IC) devices can include a die contained within a structure ("package") in which electrical pads of the die can be electrically connected to a set of leads or pins of the package. A die is typically formed by dividing a fabricated semiconductor wafer into sections and subsequently assembling them into a package.

Integrated Circuit (IC) devices can be packaged in a number of different configurations depending on their end use. In most conventional arrangements, the physical layout of pads on a die are predetermined and not capable of being modified. At the same time, system designers may dictate packet pinout configurations for components that are not subject to modification in order to ensure compatibility with existing wiring routes, power supply bus limitations, or other system requirements.

To better understand various aspects of the embodiment shown below, various known IC device die and packaging examples will briefly be described.

Referring now to FIGS. 8A-8C, an example of a conventional IC device is shown in a top and side views. The conventional IC device can include a die 800 having a first set of pads 810-0 and a second set of pads 810-1. FIGS. 8B-8C show a package 803 including a first set of bond targets 840-0, and a second set of bond targets 840-1. Bond targets (840-0 and 840-1) can each provide a signal path to a different external package connection (e.g., pin, solder ball, lead, etc.). In the example of FIGS. 8A to 8C, the physical layout of the first and second set of pads 810-0, 810-1 is designed to correspond to the physical layout of the first and second set of bond targets 840-0, 840-1. That is, a numerical order of set of data input/output (I/O's) of the die and the package can coincide physically.

Referring now to FIGS. 9A-9B, another second example of conventional IC device is shown in two views. The second conventional IC device can include a die 900 having a first set of pads 910-0 and a second set of pads 910-1. FIG. 9B shows a package 903 including a first set of bond targets 940-0 and a second set of bond targets 940-1. The physical layout of the first conventional package 903 differs from the layout of the second conventional package 903 in that the numerical order of the first set of pins 940-0 is reversed compared with the first set of pins 940-0. It is noted that due to the specific ordering of inputs/outputs of each package (803 and 903), die 800 of FIG. 8A, could not practically be placed in package 903, and die 900 could not practically be placed in package 803 as bond wires from pads to bond targets would involve too many impermissible wire crossovers. Accordingly, making one device design suitable for an incompatible package pin configuration can require an entire redesign of the die to route signals to different locations.

BRIEF DESCRIPTION OF THE DRAWINGS

FIGS. 8A-8C are top and cross-sectional views of a conventional IC device and package.

FIGS. 9A-9B shows top views of another conventional IC device and package.

DETAILED DESCRIPTION

Various embodiments of the present invention will now be described in detail with reference to a number of drawings. The embodiments include an integrated circuit (IC) device having re-configurable input/output pinouts, and methods for operating re-configurable sections of such an IC device.

Figure 1:
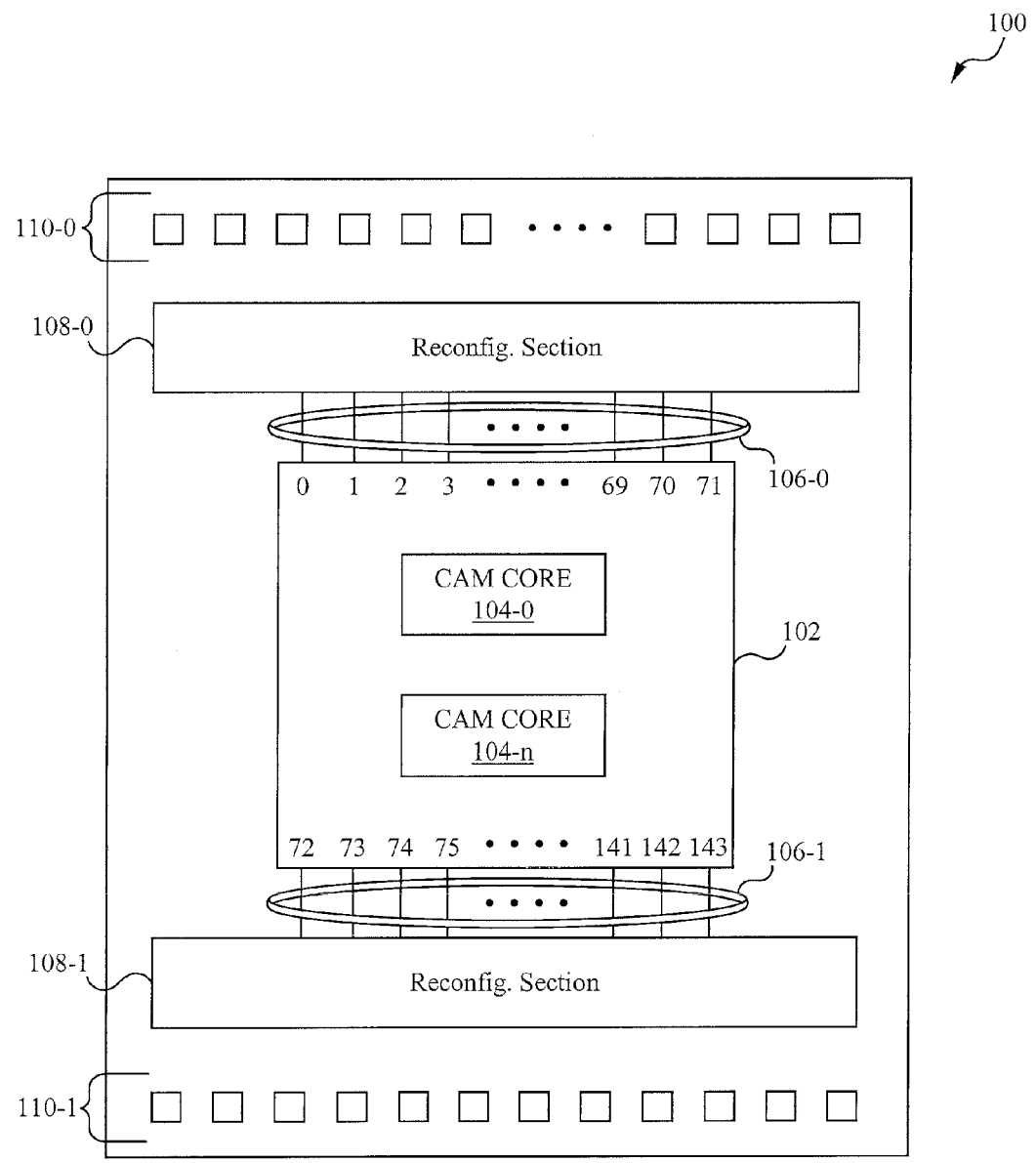
FIG. 1 is a block schematic diagram showing an integrated circuit device according to a first embodiment of the invention.

Referring now to FIG. 1, an integrated circuit device according to a first embodiment is shown in a block schematic diagram and designated by the general reference character 100. An IC device 100 can include a core 102, a first and second set of signal data paths 106-0 and 106-1, a first and second configuration circuit 108-0 and 108-1, and a first and second set of pads or physical connection points 110-0 and 110-1. A core 102 can include circuits that execute predetermined functions, and in the particular example of FIG. 1, is shown to include a number of core logic sections 104-0 through 104-n. Core logic sections (104-0 through 104-n) can be repeated circuit structures that can be interconnected with one another to provide an overall IC device function. In one particular arrangement, core logic sections (104-0 through 104-n) can include content addressable memory (CAM) core logic sections. CAM core logic sections can receive a compare data value (sometimes referred to as a comparand or search key), and compare such a value against a number of stored data values. In most configurations, such an operation can match a compare data value against a very large number of stored data values (e.g., thousands or millions), essentially simultaneously. A core 102 can be electrically connected to a first and second configuration circuits 108-0 and 108-1 by signal data paths 106-0 and 106-1, respectively.

A first and second set of signal data paths 106-0 and 106-1 can provide input signals to and/or output signals from a core 102.

Unlike conventional arrangements, like those shown in FIGS. 8A and 9A, a core 102 can be electrically connected with a first and second set of physical connection points 110-0 and 110-1 through first and second configuration circuits 108-0 and 108-1, respectively. First and second configuration circuits (108-0 and 108-1) can be separately configurable to alter a physical order between signal paths 106-0 and 106-1 and corresponding physical connection points 110-0 and 110-1, respectively. As but one particular example, while referring to FIG. 1, in one configuration, a first configuration circuit 108-0 can connect signals of signal path 106-0 to connection points 110-0 in a manner that maintains the physical order of signal path 106-0. As a result, a first set of physical connection points 110-0 can be arranged (from left to right in FIG. 1) in numerical order 0-71, matching the order of signal path 106-0 (as labeled from origination locations of core 102). Alternatively, in another configuration, a first configuration circuit 108-0 can connect signals of signal path 106-0 to connection points 110-0 in a manner that reverses the physical order of signal path 106-0. As a result, a first set of physical connection points 110-0 can be arranged (again, from left to right in FIG. 1) in a numerical order of 71-0.

In this way, an integrated circuit can include one or more configuration circuits that can alter a mapping between signal paths and external connection points of the integrated circuit.

Various examples of circuits that can be included in an embodiment like that of FIG. 1 will now be described with reference to FIGS. 2A and 2B.

Figure 2A:
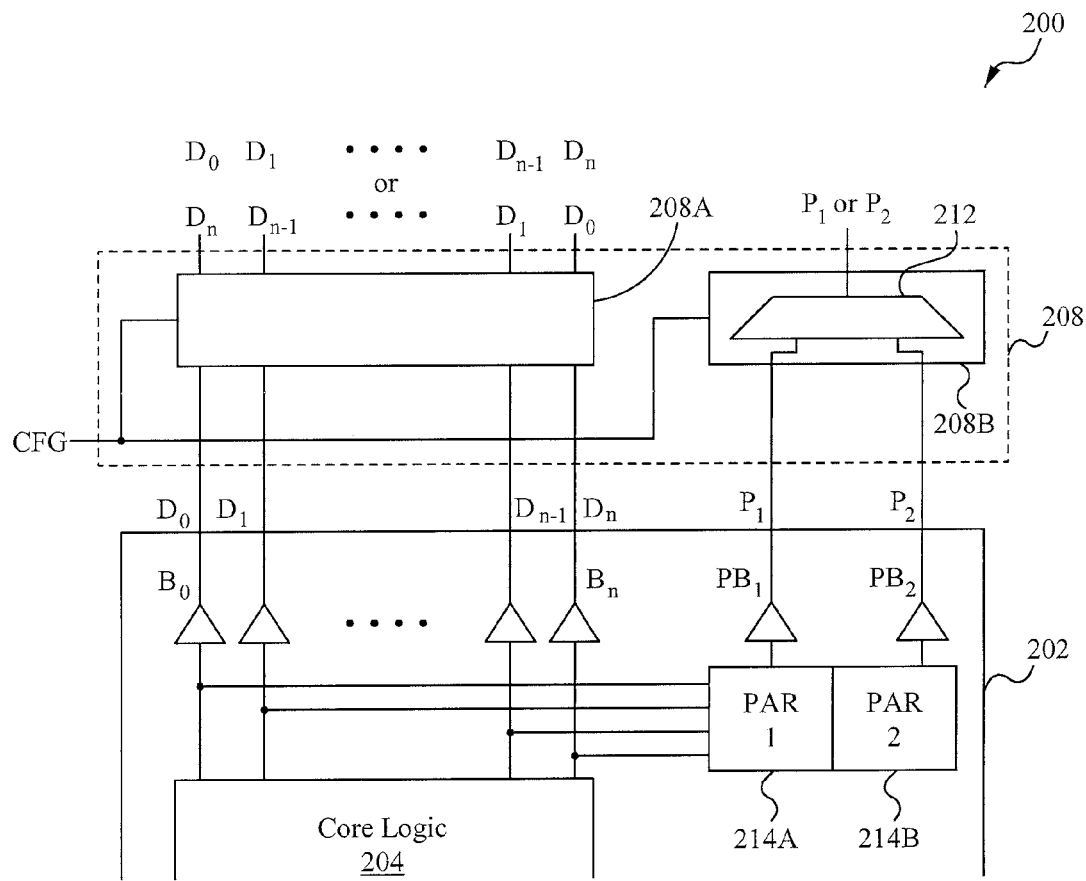
FIG. 2A is a block schematic diagram showing an IC device output section according to an embodiment.

Referring now to FIG. 2A, an output section of an IC device, that can be included in an embodiment like that of FIG. 1, is shown in a block schematic diagram and designated by the general reference character 200. An output section 200 can include some of the same general sections as FIG. 1, thus like sections are referred to by the same reference character but with the first digit being a "2" instead of a "1". Such like sections include a core 202 and a configuration circuit 208.

In the example of FIG. 2A, a core 202 can include a core logic section 204, signal paths D0-Dn, and output buffer circuits B0-Bn. Optionally, a core 202 can also include parity generators 214A and 214B.

A core logic section 204 can include circuits that generate output signals, including but not limited to circuits such as microprocessors or microcontrollers, digital signal processors, memory circuits, logic gates, and other various circuits. In a very particular example of FIG. 2A, a core logic section 204 can include CAM core circuits (not shown). A CAM core circuit can include a number of CAM memory cells (not shown) arranged in a logical fashion (e.g., rows, words, etc.) to store data values for comparison with a compare data value (also called a search key or comparand). Such CAM memory cells typically include a storage circuit for storing one or more bit values as well as a compare circuit for comparing the stored data value(s) with corresponding portions of a received search key.

Signals output from core logic 204 can be driven by output buffers (B0-Bn) on signal paths D0-Dn to provide inputs to configuration circuit 208. It is understood that signal paths D0-Dn going into configuration circuit 208 can have a predetermined physical order. This is in contrast to signals paths coming out of configuration circuit 208A, which can have a physical order that varies based on configuration information CFG.

Parity generators 214A and 214B can be included in cases where signal paths D0-Dn carry output data. Parity generators (214A and 214B) can generate a parity value from data present on signal paths D0-Dn. In the particular example of FIG. 2A, each parity generator (214A and 214B) can base a parity calculation according to a different order of the data on signal paths D0-Dn. In this way, in the event a configuration circuit 208 alters the physical order in which data is output, a parity value can exists corresponding to such an altered order. In one very particular arrangement, one parity generator 214A can generate a parity bit PB1 from a portion of data values taken left to right (i.e., D0, D1 . . . D7), while the other parity generator 214B can generate a parity bit PB2 from like portion of data values taken right to left (i.e., Dn, Dn-1 . . . Dn-7).

A configuration circuit 208 can generally include a switching module 208A, and optionally, a parity output switch 208B. According to configuration information CFG, a switching module 208A can rearrange the predetermined physical orders for electrically connecting signal data paths D0-Dn received from core logic 204 to corresponding physical connection points (not shown). A parity output switch 208B can include a suitable logic switch 212, for example a 2-to-1 multiplexer, for providing a parity signal data path P1 or P2 depending on a value of configuration information CFG. A parity output switch 208B can provide a parity signal data path P1 or P2 to a physical connection point. It is noted that an output from parity output switch 208B could itself be provided as an input to switching module 208A to allow a parity value to be selectively mapped to any of a number of different physical connection points.

In this way, output signals from an integrated circuit device can be mapped to different sets of physical connection points. In addition, parity values based on different orders of the output signals can be generated prior to such signals being remapped.

While embodiments of the invention can include reconfiguring a physical mapping of output signals, other embodiments can include reconfiguring input signals. One particular example of such an arrangement is shown in FIG. 2B.

Figure 2B:
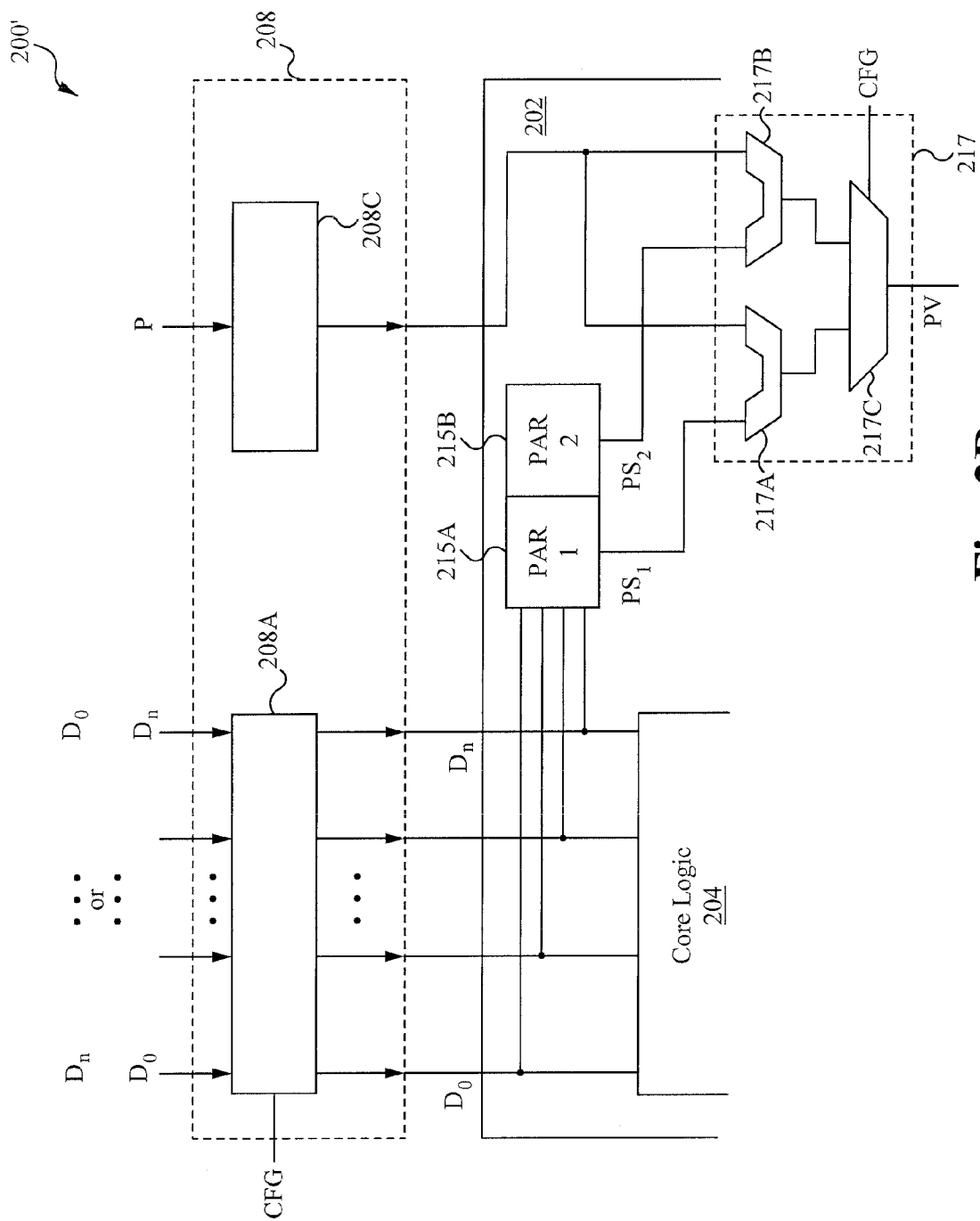
FIG. 2B is a block schematic diagram showing an IC device input section according to an embodiment.

Referring now to FIG. 2B, an input section of an IC device, like that of FIG. 1, is shown in block schematic diagram and designated by the general reference character 200'. An input section 200' can include some of the same general sections as FIG. 1, thus like sections are referred to by the same reference character but with the first digit being a "2" instead of a "1". In the example of FIG. 2B, an input section 200' can include a core 202 and a configuration circuit 208.

A core 202 can have the same general arrangement, and be subject to the same variation as core 202 shown in FIG. 2A. However, in the arrangement of FIG. 2B, core 202 can include core logic 204 that receives signals coming out of configuration circuit 208 which have a predetermined physical order. This is in contrast to signals paths going into configuration circuit 208, as is the case for FIG. 2A.

Optionally, a core 202 can include two or more parity generators 215A and 215B and a parity check circuit 217. Parity generators 215A and 215B can receive data values from signal data paths D0-Dn and generate parity values therefrom. The parity values can correspond to sets of data corresponding to different physical orders. Such values can be provided to a parity checker circuit 217.

A parity checker circuit 217 can include comparators 217A, 217B and a selector 217C. Each comparator 217A and 217B can receive a different parity value (PS1, PS2) and compare such a value against a received parity value (PS1 or PS2). Selector 217C can output one of the parity check results as value PV based on configuration information CFG.

In this way, an input section can generate a parity value reflecting an order of data values as received at external inputs, where the order of such data values is changed prior to being applied to an internal portion of the device.

Just as the reordering of data values can affect parity calculations, such reordering may also affect test structures and test methods for a corresponding integrated circuit device. One example of test structure according to the embodiments is shown in FIGS. 3 and 3A.

Figures 3, 3A:
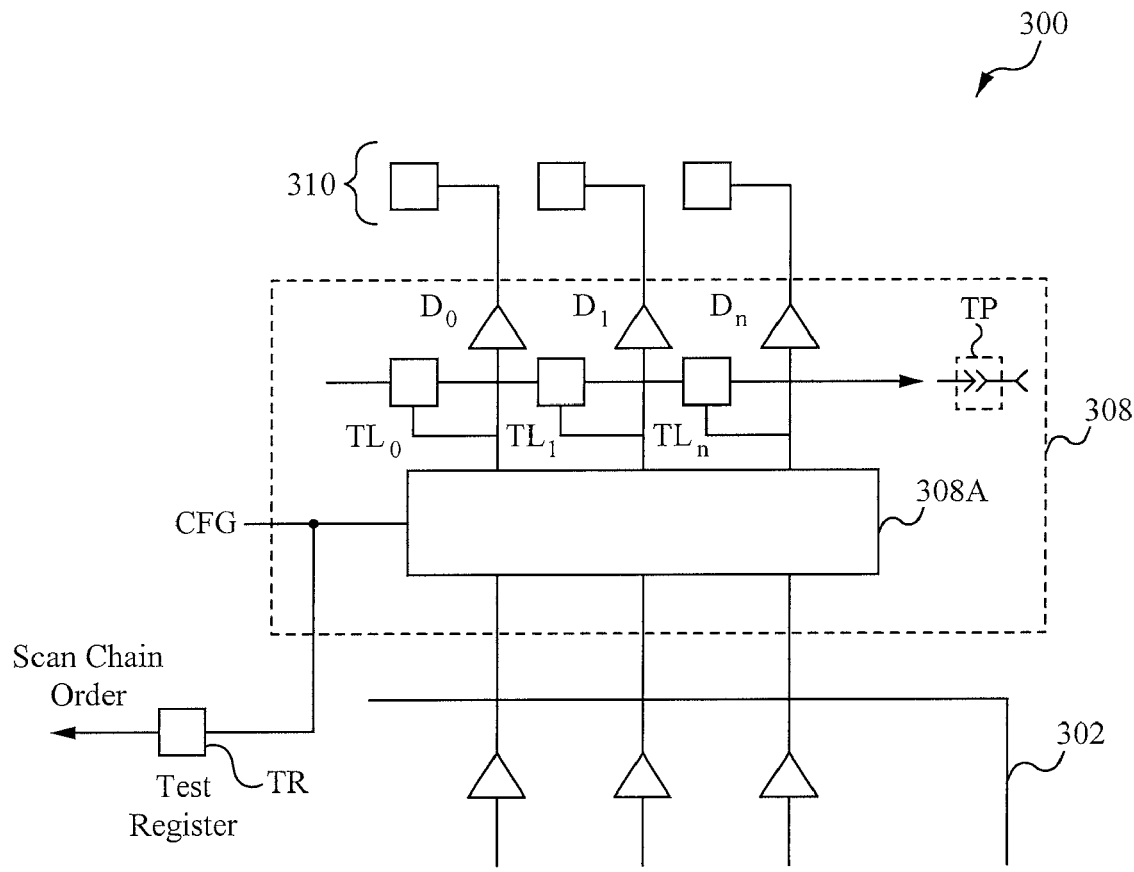
FIG. 3 is a functional block diagram showing another IC device output section according to an embodiment of the invention.
FIG. 3A is a table showing data values that can be stored in test latches of an IC device output section like that of FIG. 3.

Referring now to FIG. 3, an IC device test arrangement according to an embodiment is shown in a block schematic diagram and designated by the general reference character 300. A test arrangement 300 can include some of the same general sections as FIG. 1, thus like sections are referred to by the same reference character but with the first digit being a "3" instead of a "1". Shown in FIG. 3 is a core 302, configuration circuit 308, and a number of physical connection points 310.

A configuration circuit 308 can include a switching module 308A, data paths D0-Dn, and test latches TL0-TLn. A switching module 308A can selectively remap an order of signals originating from core 302 to provide signals on data paths D0-Dn. Test latches TL0-TLn can be connected to data paths D0-Dn, and can capture values on such data paths as test values. In the arrangement of FIG. 3, test latches TL0-TLn can be connected to one another to form a scan chain. Test data captured by such a scan chain can be read out in a serial manner at a test port TP.

Referring still to FIG. 3, because a switching module 308A can alter a mapping between signals originating in core 302 and data paths D0-Dn, test data captured by test latches TL0-TLn can vary depending upon how switching mode 308A is configured. Thus, the arrangement of FIG. 3 can include a test register TR that can store configuration information CFG. Such data can be read by a test program. Alternatively, test register TR can be included in a scan chain, and read out with other test data. While FIG. 3 shows an arrangement in which output values are captured as test data, other embodiments can apply input test values in such a scan chain. Further, configuration information for configuring a switching module 308A could also be entered as part of a scan chain.

FIG. 3A shows how test data can vary according to configuration information. In the particular example shown, configuration information (CFG1 or CFG2) can specify a particular bit order of output data.

In this way, configuration information for a switching circuit can be output as test data to enable testers to determine which signal order a device is configured into.

As noted above, the embodiments of the invention can include switching circuits for remapping signals received in one order, to output signals of a different order. While switching circuits can take various forms, particular examples of switching circuits that can be included in the embodiments will now be described.

Figure 4:
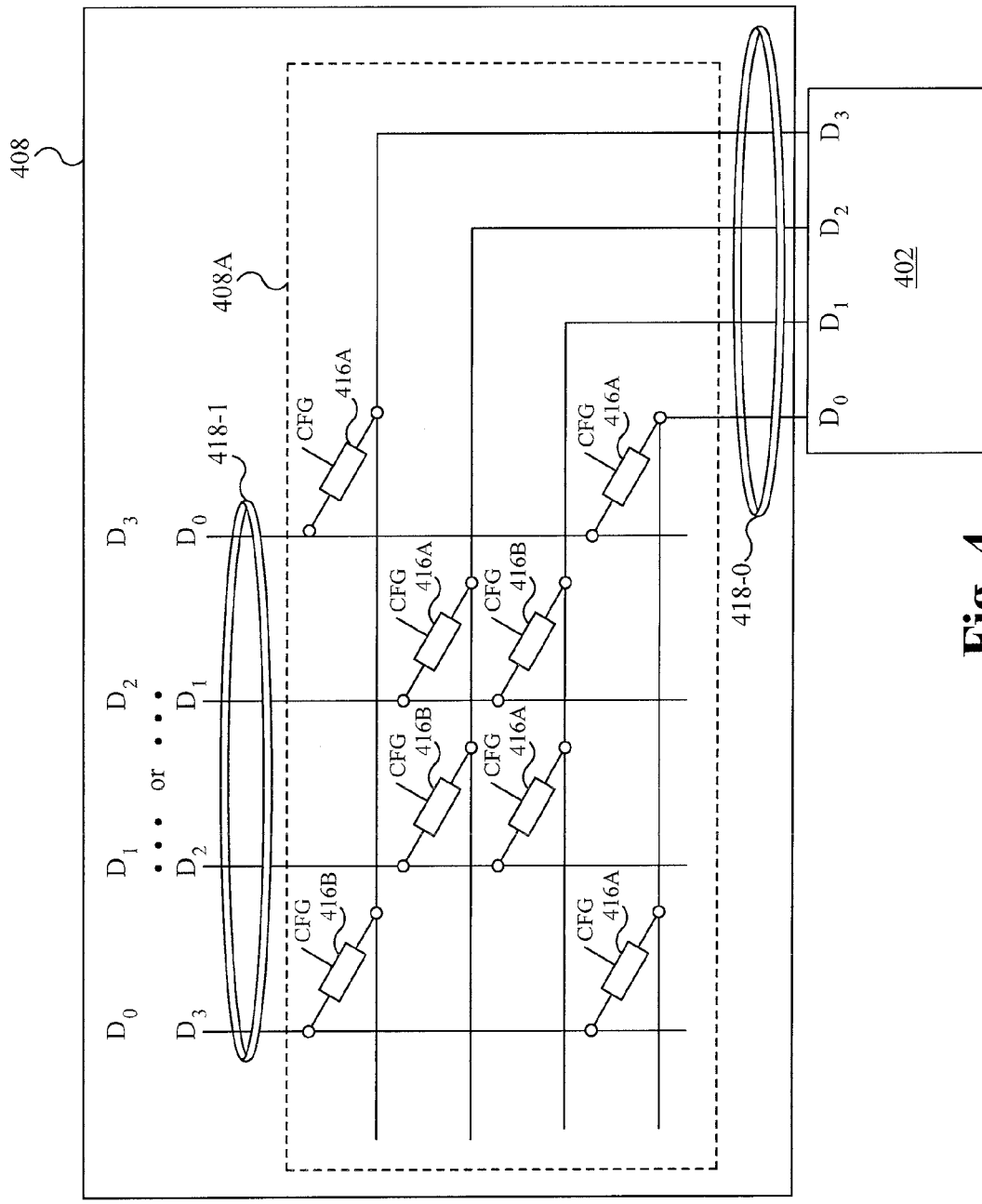
FIG. 4 is a schematic diagram showing one example of a switching circuit that can be included in the embodiments.

Referring now to FIG. 4, switching circuit that can be included in the embodiments is shown in a block schematic diagram and designated by the general reference character 400. A switching circuit 400 can be a "cross bar" type switching circuit that includes programmable elements 416A and 416B at intersections of input lines 418-0 and output lines 418-1. Programmable elements (416A and 416B) can be enabled (provide a low impedance) or disabled (provide a high impedance) based on configuration information CFG. The very particular example of FIG. 4 shows an arrangement where enabling one set of programmable elements 416A provides one physical order for output signals (D3 to D0, going from left to right in the picture), while enabling the other set of programmable elements 416B provides the reverse physical order (D0 to D3, going from left to right in the picture). However, such a particular arrangement, while advantageous in some applications, should not necessarily be construed as limiting to the invention. As but one example, programmable elements could be situated at fewer or greater numbers of intersections allowing for greater variation in the mapping of input signal lines to output signal lines.

The structure of FIG. 4 could also be used as a configurable input path circuit.

Figure 5:
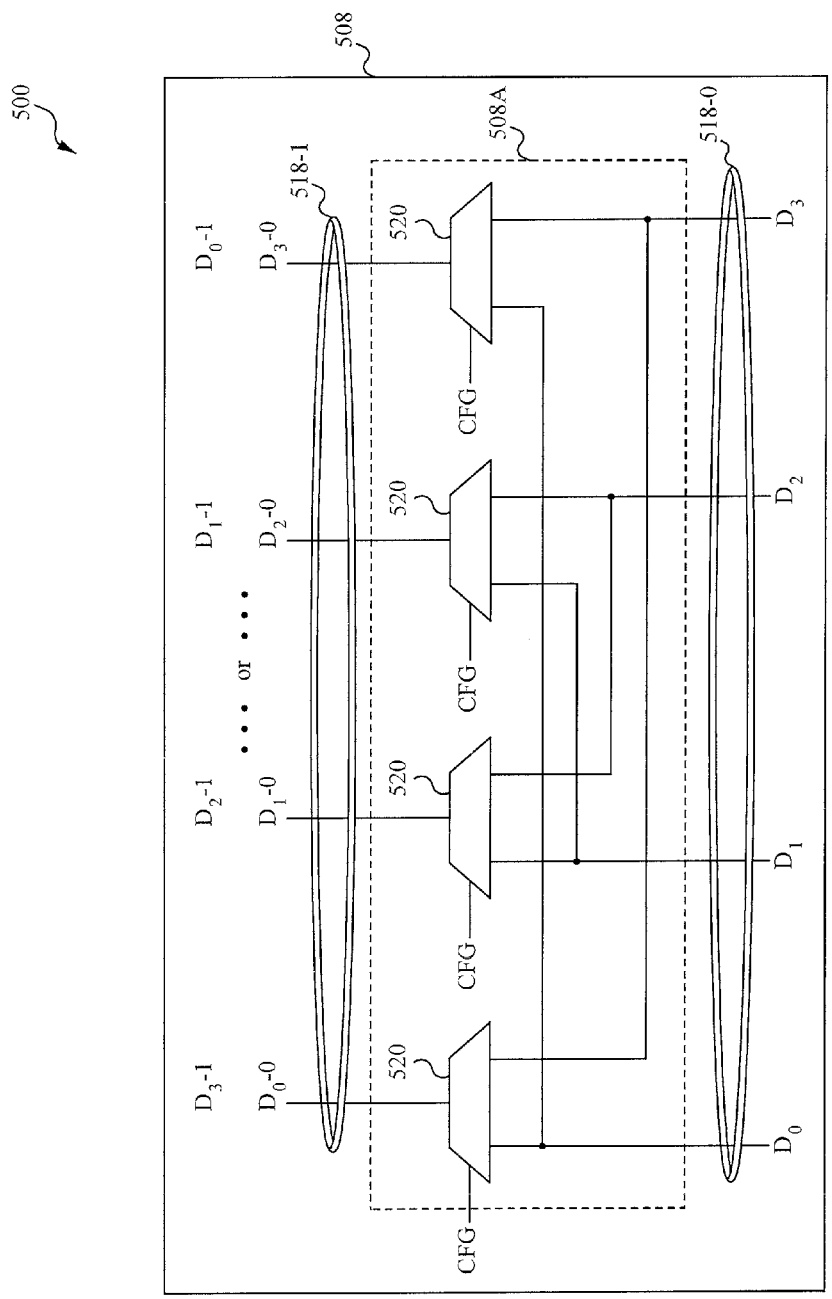
FIG. 5 is a schematic diagram showing another one example of a switching circuit that can be included in the embodiments.

Referring now to FIG. 5, another example of a switching circuit is shown in a block schematic diagram and designated by the general reference character 500. A switching circuit can include a switching module 508A that selectively allows a signal from one of multiple input data lines 518-0 to be provided on one of multiple output data lines 518-1. A switching module 508A can include a network of switching logic circuits 520. A network of switching logic circuits 520 can include numbers of suitable logic switches that can each connect a single input to one or more outputs. Any suitable logic switch known to a person of skill in the art can be used. In the very particular example of FIG. 5, a network of switching logic circuits 520 can include multiplexer circuits controlled by configuration information CFG.

While FIG. 5 shows an output data path, other embodiments can include input data paths formed in the same general fashion. As but a first example, the multiplexers could be substituted with de-multiplexers that can selectively connect one incoming data value to one of input data lines 518-0. Alternatively, a direction of switching module 508A could be switched, with input data lines 518-0 being connected to physical connection points, and output data lines 518-1 being connected to a core. In this way, signal paths between a core portion, or the like, of an integrated circuit and physical connection points of the integrated circuit can be mapped to one another according to two or more configurations that alter the physical order of signals with respect to one another.

In particular embodiments, groups of signals may be input or output according to different timing signals. For example, the timing of one group of signals may be based on a first phase of a clock cycle, while the timing of another group of signals may be based on a second phase of the clock cycle. As a result, a physical reordering of signals must take into account such different timings for different groups of signals. Examples of configuration circuits for accommodating different timings are shown in FIGS. 6A and 6B.

Figure 6A:
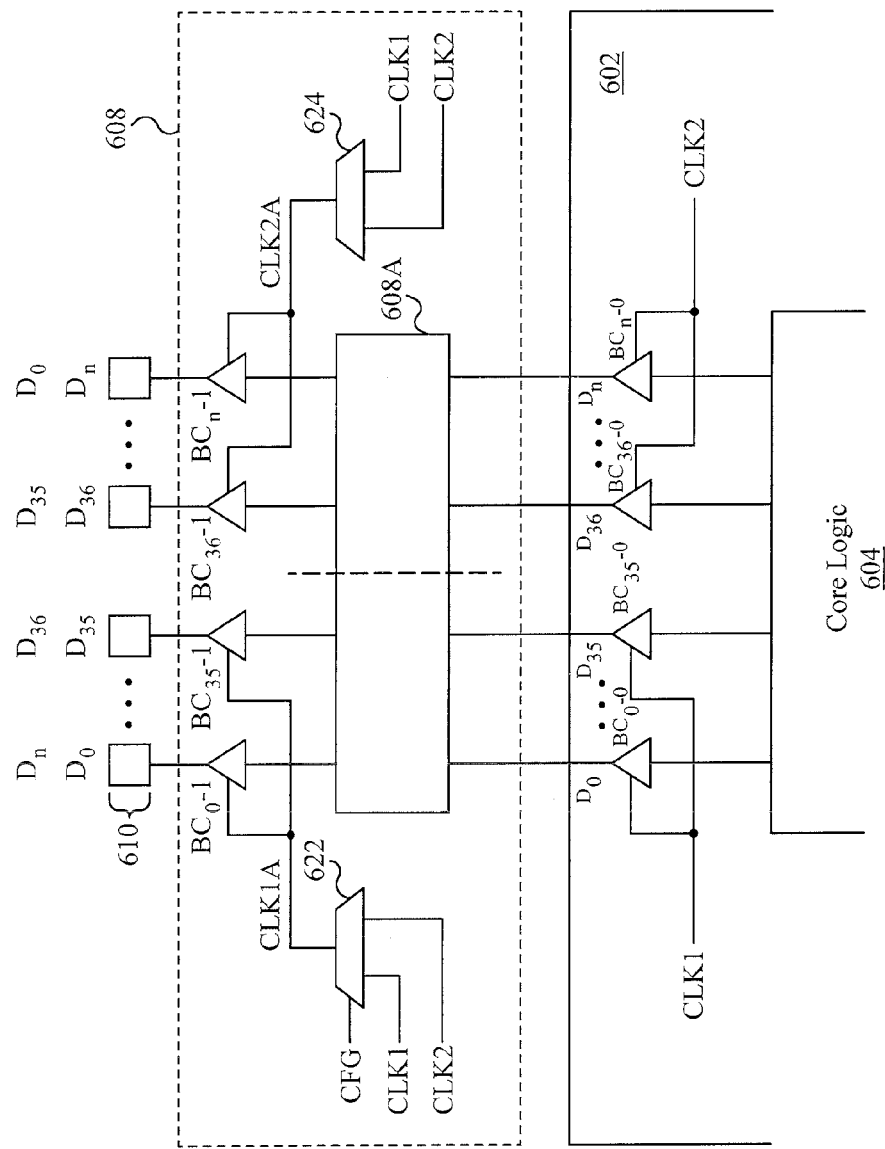
FIG. 6A is a functional block diagram showing yet another IC device output section according to an embodiment of the invention.
Figure 6B:
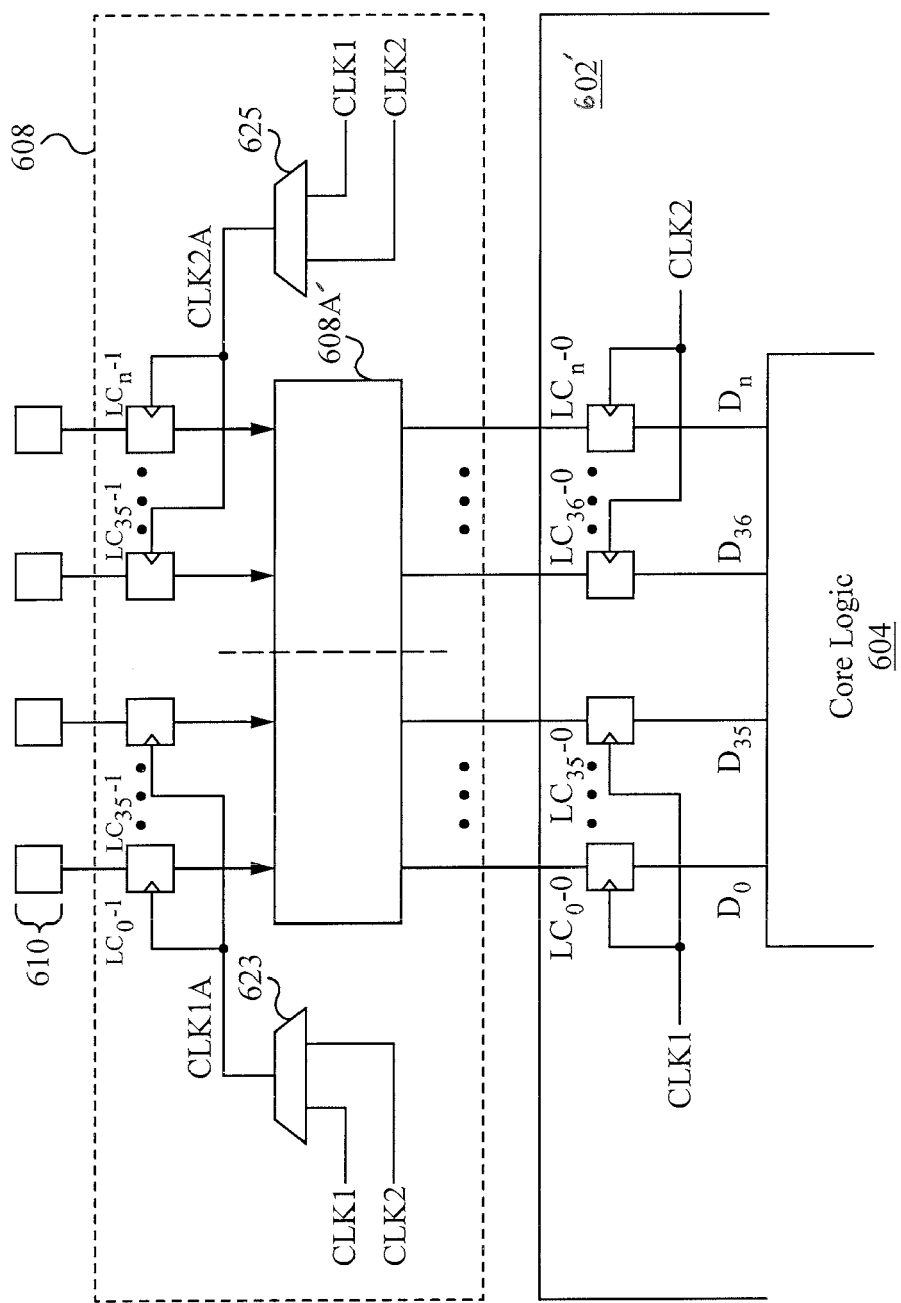
FIG. 6B is a functional block diagram showing yet another IC device input section according to an embodiment of the invention.

Referring now to FIG. 6A, an output section according to an embodiment is shown in a block schematic diagram and designated by the general reference character 600. An output section 600 can include a core 602, a configuration circuit 608 and a number of physical connection points 610. A core 602 can include a core logic section 604, and a number of signal data paths D0-Dn controlled by clocked gating circuitry, which in this particular example can be clocked output buffer circuits BC0-0-BCn-0. A core 602 can generally have a structure the same as, or equivalent to those described above. Signal data paths D0-Dn can be arranged between a core logic section 604 and a configuration circuit 608. Clocked buffer circuits BC0-0-BCn-0 can receive signals at inputs, and drive signals on corresponding outputs in response to a clock control signal. Clocked buffer circuits BC0-0-BCn-0 can be divided into different groups that are enabled in response to different timing signals. In the arrangement of FIG. 6A, a first clock signal CLK1 can control the operation of output buffer circuits BC0-0-BC35-0, while as second clock signal CLK2 can control the operation of buffer circuits BC36-0-BCn-0. Thus, a first clock signal CLK1 can be used to clock a first portion of a signal data path (D0-D35), while a second clock signal CLK2 can be used to clock a second portion of a signal data path (D36-Dn).

Configuration circuit 608 can selectively alter a physical order of received inputs (D0-Dn) to provide signals at physical connection points 610. A configuration circuit 608 can include a switching module 608A, second output buffer circuits BC0-1-BCn-1, and clock selectors 622 and 624. Switching module 608A can provide the remapping of signal paths in response to configuration information CFG. In the particular example of FIG. 6A, it is assumed that switching module 608A can reverse signal orders in response to configuration information CFG.

Second buffer circuits BC0-1-BCn-1 can drive output signals received from switching module 608A. Second clocked buffer circuits BC0-0-BCn-0 can be divided into different groups that can be enabled in response to different timing signals. In the arrangement of FIG. 6A, a first clock signal CLK1A can control the operation of output buffer circuits BC0-1-BC35-1, while as second clock signal CLK2A can control the operation of buffer circuits BC36-1-BCn-1. Clock signals CLK1A and CLK1B can be selected from clock signals CLK1 or CLK2 (i.e., clock signals used to output data to switching module 608A from core logic 604) by clock selectors (622 and 624). In the example shown, clock selectors (622 and 624) can select one clock for output based on configuration information CFG. Such an arrangement can ensure that data can be output on physical outputs 610 according to the same timing as data output from core logic 604, whether or not switching module 608A rearranges a physical order of signals.

As but one very particular example, in one configuration (e.g., no remapping of signals), inputs D0-D35, clocked out based on clock signal clock CLK1, can be mapped by switching module 608A to second output buffer circuits BC0-1-BC35-1. At the same time, inputs D36-Dn, clocked out based on clock signal clock CLK2, can be mapped by switching module 608A to second output buffer circuits BC36-1-BCn-1. To maintain proper output timing, clock selector 622 can provide clock signal CLK1 as clock CLK1A, while clock selector 624 can provide clock signal CLK2 as clock CLK2A. In contrast, in another configuration (e.g., reverse remapping of signals), inputs D0-D35, clocked out based on clock signal clock CLK1, can be mapped by switching module 608A to second output buffer circuits BC36-1-BCn-1. At the same time, inputs D36-Dn, clocked out based on clock signal clock CLK2, can be mapped by switching module 608A to second output buffer circuits BC36-0-BCn-35. In this configuration, to maintain proper output timing, clock selector 622 can provide clock signal CLK2 as clock signal CLK1A, while clock selector 624 can provide signal CLK1 as clock CLK2A. It is understood that clock signals CLK1/CLK2 at inputs of clock selectors (622 and 624) can be delayed versions of clock signals CLK1/CLK2 used to drive output buffer circuits (BC0-0-BCn-0). Further, in very particular examples, CLK1 and CLK2 can be considered active on different phases of a same clock cycle.

Just as clock selection can be used to ensure remapped output signals follow internal timing sequences, clock selection can also be used to ensure that remapped internal clock signals follow external timing sequences. An example of such an arrangement is shown in FIG. 6B.

Referring now to FIG. 6B, an input section according to an embodiment is shown in a block schematic diagram. The input section of FIG. 6B can include a core 602', a configuration circuit 608' and a number of physical connection points 610. A core 602' can include a core logic section 604, a number of signal input paths D0-Dn controlled by clocked gating circuitry, which in this particular example can be core clocked registers LC0-0-LCn-0. A core 602 can have structure of cores noted above, and equivalents. Clocked registers LC0-0-LCn-0 can be divided into different groups that are enabled in response to different timing signals. In the arrangement of FIG. 6A, a first clock signal CLK1 can control the operation of registers LC0-0-LC35-0, while a second clock signal CLK2 can control the operation of registers LC36-0-LCn-0. Thus, a first clock signal CLK1 can be used to clock a first portion of a signal data path (D0-D35), while a second clock signal CLK2 can be used to clock a second portion of a signal data path (D36-Dn).

Configuration circuit 608' can selectively alter a physical order of signals received at physical connection points 610 to provide inputs to core 602'. A configuration circuit 608 can include a switching module 608A', second clocked registers LC0-1-LCn-1, and clock selectors 623 and 625. Switching module 608A' can provide the remapping of signal paths in response to configuration information CFG. In the particular example of FIG. 6B, it is assumed that switching module 608B can reverse signal orders in response to configuration information CFG.

Second clocked registers LC0-1-LCn-1 can latch signals received on physical connection points 610 and output such signals to switching module 608A. Second clocked registers (LC0-1-LCn-1) can be grouped in the same fashion as core clocked registers LC0-0-LCn-0. That is, second clocked registers LC0-0-LCn-0 can be divided into different groups that can output data in response to different timing signals. In the arrangement of FIG. 6B, a first clock signal CLK1A can control the operation of registers LC0-1-LC35-1, while as second clock signal CLK2A can control the operation of registers LC36-1-LCn-1. Clock signals CLK1A and CLK1B can be selected from clock signals CLK1 or CLK2 (i.e., clock signals used to input data to core logic core logic 604), with clock selectors (623 and 625). In the example shown, clock selectors (623 and 625) can select one clock for output based on configuration information CFG. Such an arrangement can ensure that data can be input to core logic 604 according to the same timing as data received on physical outputs 610, whether or not switching module 608A' rearranges a physical order of such signals.

The above embodiments have shown arrangements in which data paths can reconfigured according to configuration information CFG. In some arrangements, such configuration information may be stored in a volatile or nonvolatile storage circuits present on the same integrated circuit. In other arrangements, such configuration information can be dynamically applied via inputs to an integrated circuit. However, since reconfiguration of data paths according to the embodiments can be implemented to enable a single integrated circuit die to meet different package pinouts, preferably, configuration of data paths can occur at an assembly stage. As a first example, configuration data can be established by a laser fuse structure (fusible link opened by a laser). As a second example, configuration information can be established by a bond option. One example of such an approach is shown in FIGS. 7A and 7B.

Figure 7A:
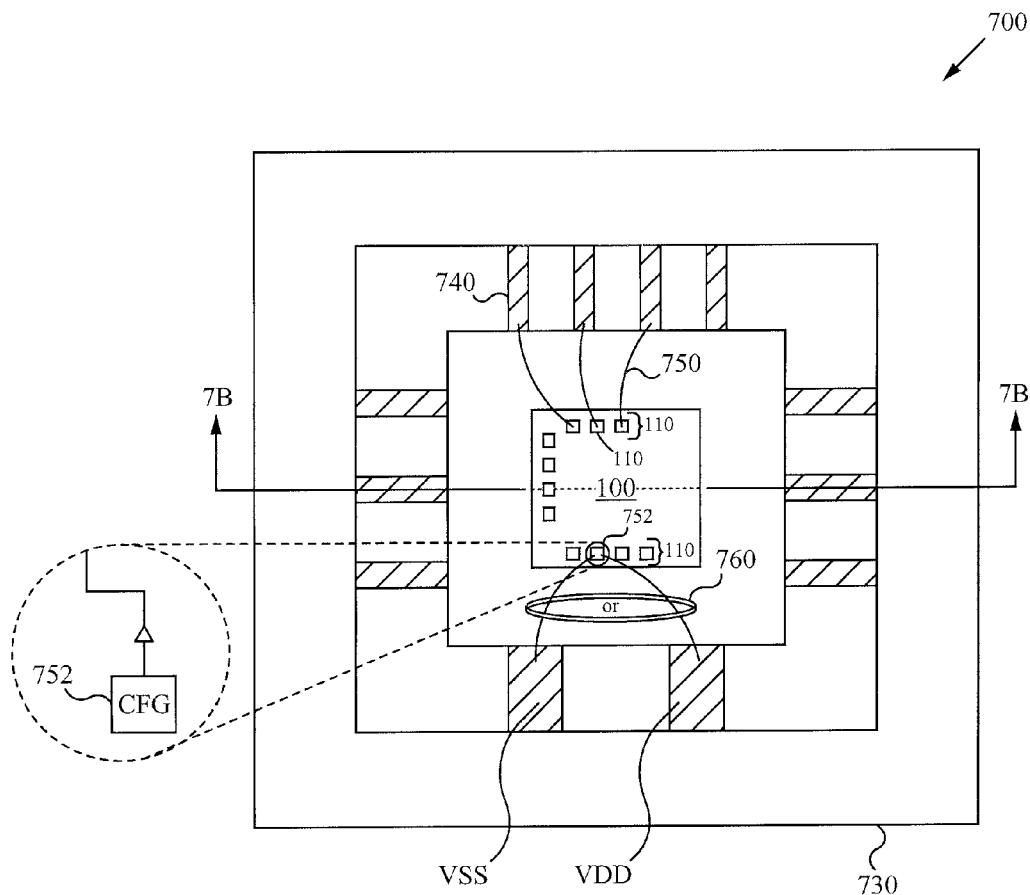
FIGS. 7A and 7B show top and cross sectional views of an IC device mounted in a package according to another embodiment.
Figure 7B:
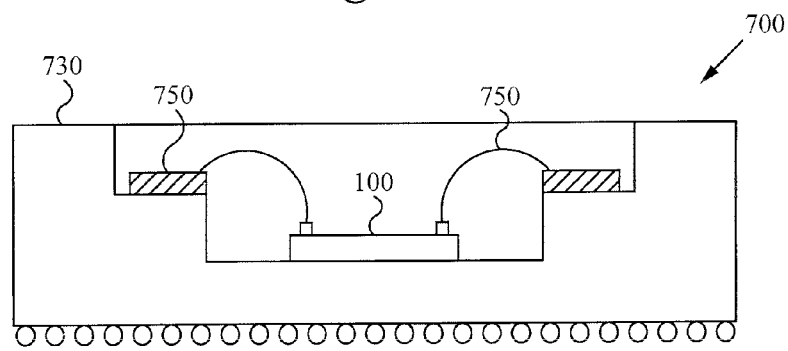

Referring now to FIGS. 7A and 7B, an IC device is shown in top view and a side cross-sectional view taken along the line 7B-7B of FIG. 7A. The IC device is designated by the general reference character 700 and can include a die 100 and a package 730. A die 100 can include embodiments like those shown in FIGS. 1-6B, or equivalents. Thus, a die 100 can include a number of physical connection points 110. One or more such connection points can serve as a bond option connection point 752.

A package 730 can include a number of bond targets 740 that can be connected to physical connection points 110 by conductive structures 750, such as bond wires. Bond targets can include power supply leads, shown as VSS and VDD. Such leads are understood to connect to an external connection of the package that will provide power supply voltages.

In the particular example of FIG. 7A a bond option connection point 752 can be connected to either a VSS source lead or to a VDD source lead after mounting a die 100 within package 730. Connecting a bond option connection point 752 to either a VSS source lead or a VDD source lead can provide global configuration information of one particular value (VSS or VDD) as an input value to the IC device.

It is noted that embodiments disclosed herein can be suitable for enabling one integrated circuit design to be compatible with multiple package options. As but one very particular example, a die formed according to the embodiments could be compatible with a package like that shown in FIG. 8A. At the same time, the same die could be reconfigured and thus also be compatible with a package like that shown in FIG. 9B. Such reconfigurability can obviate the need to redesign a die in order to meet different signal physical order requirements.

In this way, an integrated circuit device can have inputs and/or outputs having a physical order the can be reconfigured at an assembly stage of a manufacturing flow.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit (IC) device, comprising:
 a configuration circuit that selectively connects each of a plurality of signal paths to a corresponding one of a plurality of physical connection points of the IC device according to one of at least two different orders, each signal path being enabled in response to a corresponding timing signal input; and
 a timing circuit that selectively connects at least two of a plurality of different timing signals to different groups of timing signal inputs;
 wherein:
  the signal paths are logically divided into at least a first and second group, each group having their timing signals connected to a same timing input; and
  the timing, circuit connects a first timing signal to the first group timing input and a second timing signal to the second group timing input in a first mode and connects the second timing signal to the first group timing input and the first timing signal to the second group timing input in a second mode of operation.

2. The IC device of claim 1, further including:
 the plurality of signal paths comprise output signal paths; and
 output driver circuits that output data from a core section of the IC device to the configuration circuit in response to the different timing signals.

3. The IC device of claim 2, further comprising buffer circuits connected to the signal paths to ensure that the signals received by the physical connection points has the same timing as the signals output by the core section.

4. The IC device of claim 1, further including:
 the plurality of signal paths comprise input signal paths; and
 input driver circuits that input data to a core section of the IC device from the configuration circuit in response to the different timing signals.

5. The IC device of claim 4, further comprising buffer circuits connected to the signal paths to ensure that the signals output by the physical connection points has the same timing as the signals received by the core section.

6. The IC device of claim 1, wherein:
 the configuration circuit connects each of the signal paths to the physical connection points according to different orders in response to configuration data; and
 the timing circuit selectively connects timing signals to the different groups in response to the same configuration data.

7. The IC device of claim 1, wherein:
 the configuration circuit connects each of the signal paths to the physical connection points according to different orders in response to at least one configuration value;
 the timing circuit selectively connects timing signals to the different groups in response to at least the same configuration value; and
 the configuration value is generated by an IC package assembly configuration.

8. The IC device of claim 7, wherein:
 the IC package assembly configuration includes a wire bonding.

9. The IC device of claim 1, wherein the arrangement of the connections between the signal paths and the physical connections for a first order of the at least two different orders is the reverse of the order of a second order.

10. The IC device of claim 1, wherein the first timing signal is based on a first phase of a clock cycle and the second timing signal is based on a second phase of the clock cycle.

11. A method for configuring an integrated circuit (IC) device, comprising:
 connecting selectively each of a plurality of signal paths to a corresponding one of a plurality of physical connection points of the IC device according to one of at least two different orders;
 enabling each signal path in response to a corresponding timing signal input, wherein the signal paths are logically divided into at least a first and second group, each group having their timing signals connected to a same timing input; and
 connecting selectively at least two of a plurality of different timing signals to different groups of timing signal inputs; wherein a first timing signal is connected to the first group timing input and a second timing signal is connected to the second group timing input in a first mode and the second timing signal is connected to the first group timing input and the first timing signal is connected to the second group timing input in a second mode of operation.

12. A method, according to claim 11, further comprising:
 using the signal paths to transmit data from a core section to the physical connection points in response to the different timing signals.

13. A method, according to claim 12, further comprising buffering the signal paths to ensure that the signals received by the physical connection points has the same timing as the signals output by the core section.

14. A method, according to claim 11, further comprising:
 using the signal paths to transmit data from the physical connection points to a core section in response to the different timing signals.

15. A method, according to claim 14, further comprising buffering the signal paths to ensure that the signals output by the physical connection points has the same timing as the signals received by the core section.

16. A method, according to claim 11, further comprising:
connecting each of the signal paths to the physical connection points according to different orders in response to a configuration data; and
connecting selectively the timing signals to the different groups in response to the same configuration data.

17. A method, according to claim 11, further comprising generating at least one configuration value;
connecting each of the signal paths to the physical connection points according to different orders in response to the at least one configuration value; and
connecting the timing signals to the different groups in response to at least the same configuration value.

18. A method, according to claim 11, wherein connecting each of a plurality of signal paths to a corresponding one of a plurality of connection points uses a reverse order for the second order as used for the first order.

19. A method, according to claim 11, wherein the first of the at least two of a plurality of different timing signals is based on a first phase of a clock cycle and the second of the at least two of a plurality of different timing signals is based on a second phase of the clock cycle.

20. A method, according to claim 11, further comprising assembling the IC package assembly includes a wire bonding.

* * * * *

UNITED STATES PATENT AND TRADEMARK OFFICE
CERTIFICATE OF CORRECTION

PATENT NO. : 8,324,929 B1
APPLICATION NO. : 12/826124
DATED : December 4, 2012
INVENTOR(S) : Vinay Raja Iyengar Page 1 of 1

It is certified that error appears in the above-identified patent and that said Letters Patent is hereby corrected as shown below:

In the Specifications:

Column 9, Line 51, please replace "timing, circuit" with --timing circuit--.

Column 9, Line 66, please replace "has the same" with --have the same--.

Column 12, Line 13, please replace "includes" with --including--.

Signed and Sealed this
Twentieth Day of August, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,324,929 B1
APPLICATION NO. : 12/826124
DATED : December 4, 2012
INVENTOR(S) : Vinay Raja Iyengar Page 1 of 1

It is certified that error appears in the above-identified patent and that said Letters Patent is hereby corrected as shown below:

In the Specifications:

Column 9, Line 51, Claim 1, please replace "timing, circuit" with --timing circuit--.

Column 9, Line 66, Claim 3, please replace "has the same" with --have the same--.

Column 12, Line 13, Claim 20, please replace "includes" with --including--.

Signed and Sealed this
Third Day of September, 2013

Teresa Stanek Rea
*Acting Director of the United States Patent and Trademark Office*